United States Patent
Cheng et al.

(10) Patent No.: US 7,476,604 B1
(45) Date of Patent: Jan. 13, 2009

(54) AGGRESSIVE CLEANING PROCESS FOR SEMICONDUCTOR DEVICE CONTACT FORMATION

(75) Inventors: Ning Cheng, San Jose, CA (US); Minh Van Ngo, Fremont, CA (US); Jinsong Yin, Sunnyvale, CA (US); Paul Raymond Besser, Sunnyvale, CA (US); Connie Pin-chin Wang, Menlo Park, CA (US); Russell Rosaire Austin Callahan, Dresden (DE); Jeffrey Shields, Sunnyvale, CA (US); Shankar Sinha, Redwood Shores, CA (US); Jeff P. Erhardt, San Jose, CA (US); Jeremy Chi-Hung Chou, San Jose, CA (US)

(73) Assignees: Advanced Micro Devices, Inc., Sunnyvale, CA (US); Spansion LLC, Sunnyvale, CA (US)

( * ) Notice: Subject to any disclaimer, the term of this patent is extended or adjusted under 35 U.S.C. 154(b) by 206 days.

(21) Appl. No.: 11/128,391

(22) Filed: May 13, 2005

(51) Int. Cl.
    *H01L 21/44* (2006.01)

(52) U.S. Cl. ............... 438/597; 438/677; 257/E21.294; 257/E21.495; 257/E21.575

(58) Field of Classification Search .................. 438/597, 438/677; 257/E21.294, E21.495, E21.575, 257/E21.577, E21.586
See application file for complete search history.

(56) References Cited

U.S. PATENT DOCUMENTS

| 5,449,640 | A  | * | 9/1995  | Hunt et al. | 438/640 |
|-----------|----|---|---------|-------------|---------|
| 5,486,266 | A  | * | 1/1996  | Tsai et al. | 438/750 |
| 6,391,794 | B1 | * | 5/2002  | Chen et al. | 438/745 |
| 6,664,611 | B2 | * | 12/2003 | Chen et al. | 257/639 |
| 6,725,119 | B1 | * | 4/2004  | Wake        | 700/121 |
| 6,998,352 | B2 | * | 2/2006  | Aoki et al. | 438/745 |
| 7,122,463 | B2 | * | 10/2006 | Ohuchi      | 438/624 |

* cited by examiner

*Primary Examiner*—Charles D Garber
*Assistant Examiner*—Stanetta D Isaac
(74) *Attorney, Agent, or Firm*—Harrity & Harrity LLP

(57) ABSTRACT

A method of forming a contact through a material includes forming a via through a dielectric material and cleaning the via using a dilute hydrofluoric (DHF) acid solution. The method further includes depositing a barrier layer within the via and depositing metal adjacent the barrier layer.

8 Claims, 12 Drawing Sheets

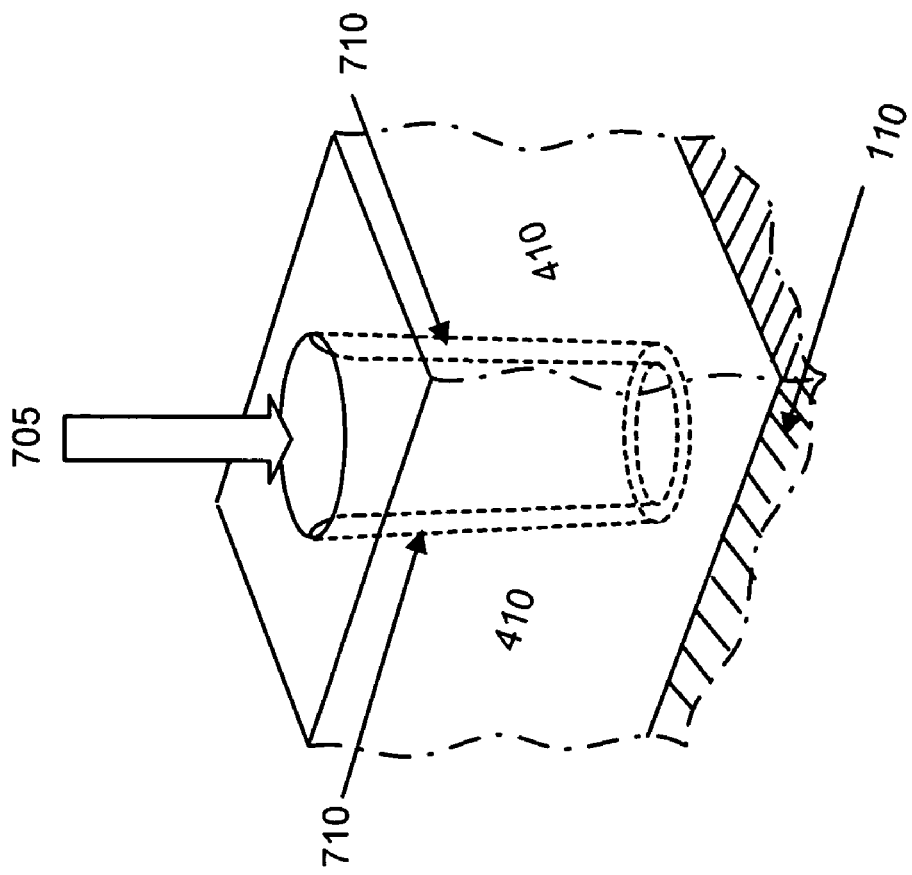
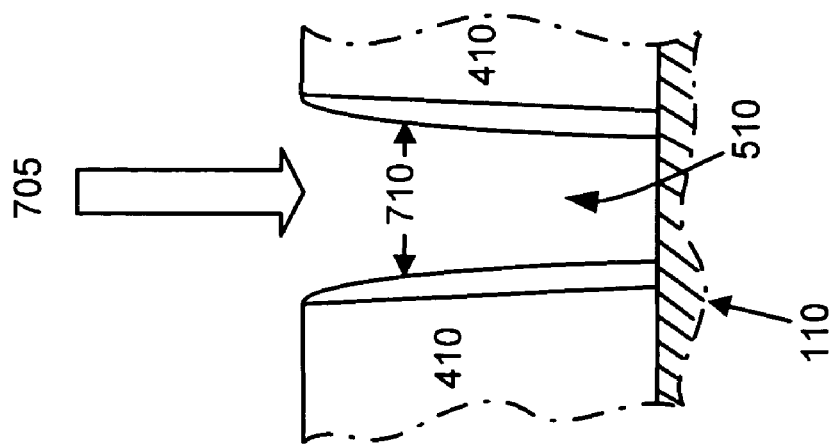
FIG. 7B
FIG. 7A

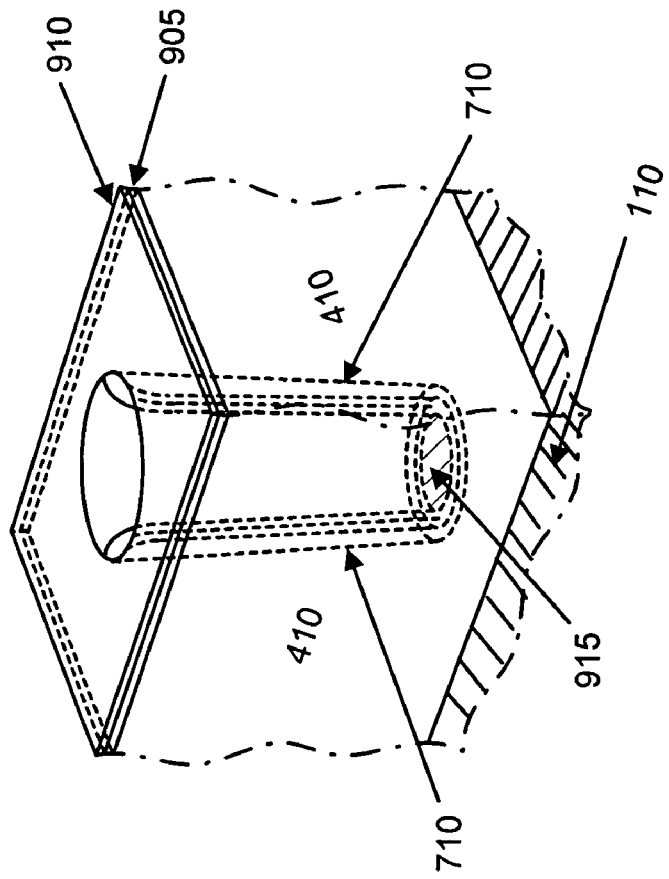
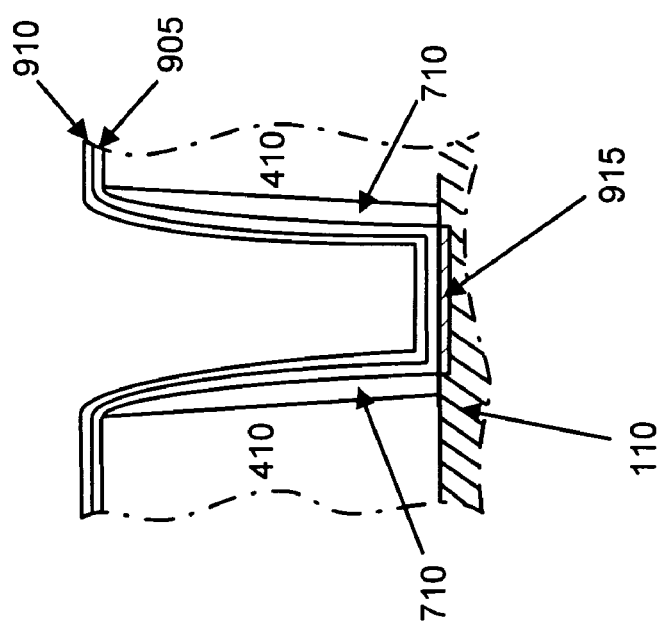
FIG. 9B
FIG. 9A

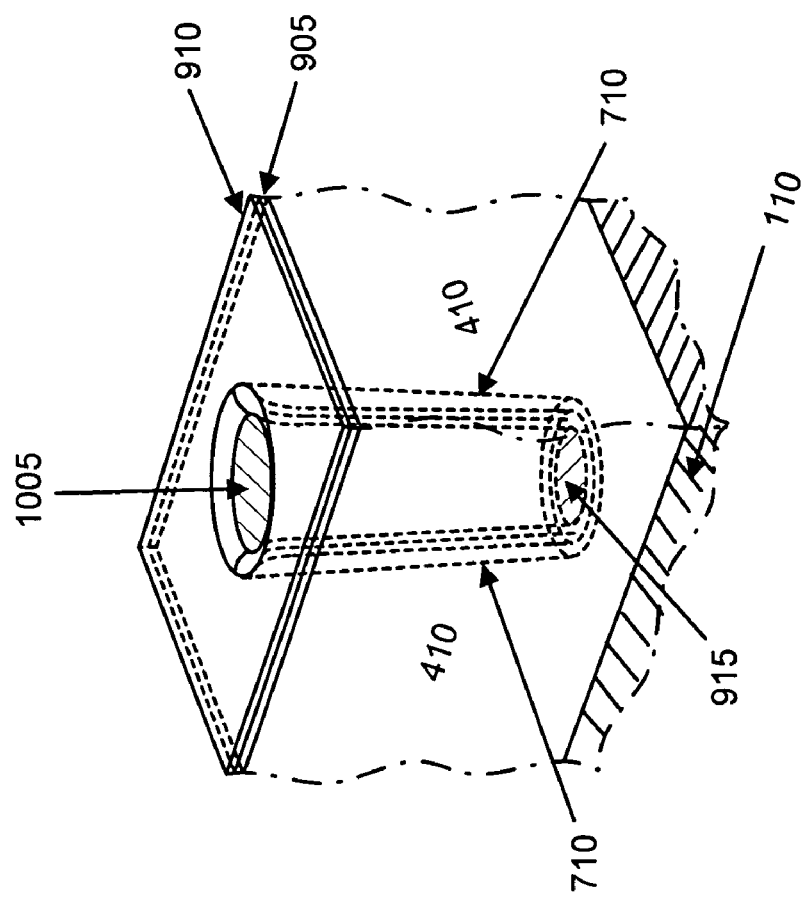
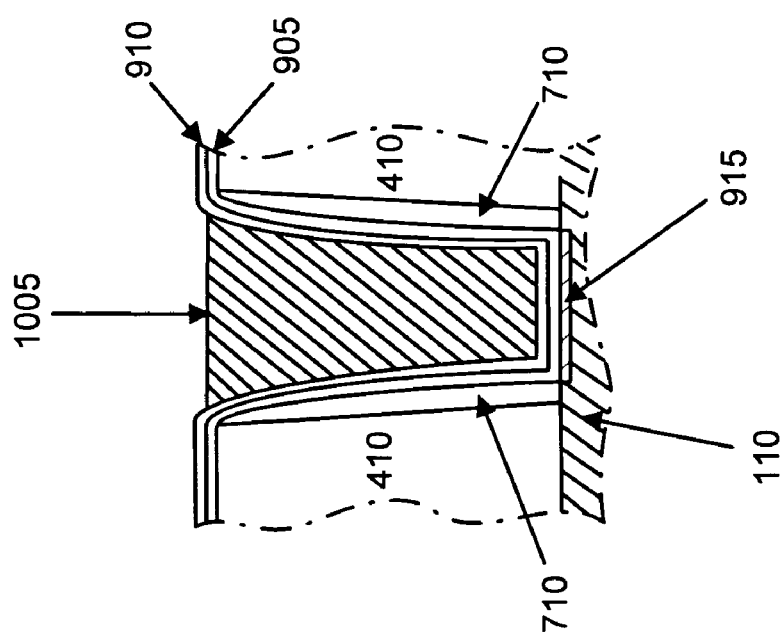
FIG. 10A
FIG. 10B

AGGRESSIVE CLEANING PROCESS FOR SEMICONDUCTOR DEVICE CONTACT FORMATION

TECHNICAL FIELD

The present invention relates generally to semiconductor devices and, more particularly, to creating contacts in semiconductor devices.

BACKGROUND ART

In many existing semiconductor devices, interlayer dielectrics (ILDs) are formed between different layers of conductors. Subsequent to formation of an ILD, various "backend" processes may be performed to complete the formation of the semiconductor device(s). For example, one backend process includes etching the ILD to create a via for a contact between the semiconductor devices, or between conductors that interconnect various conductive structures in a semiconductor device. Creation of a contact conventionally involves etching the ILD to create the via, and using existing techniques, such as a plasma clean, or argon sputtering, for cleaning the via prior to depositing a barrier metal layer within the via. Such existing techniques, however, lead to an undesirable, high contact resistance. These existing techniques, such as argon sputtering, additionally may induce device damage that causes charge loss in the resulting semiconductor device.

DISCLOSURE OF THE INVENTION

Consistent with aspects of the invention, an aggressive cleaning process is performed within a via prior to barrier metal deposition (BMD) and contact formation. The cleaning may include using a dilute hydrofluoric acid (DHF) mix (HF/$H_2O$). The cleaning may, in addition to the DHF mix, include the use of an ammonium hydroxide hydrogen peroxide mix (APM) and/or a sulfuric acid hydrogen peroxide mix (SPM). The cleaning of the present invention lowers contact resistance as compared to existing contact formation processes and reduces device damage that causes charge loss.

Additional advantages and other features of the invention will be set forth in part in the description which follows and, in part, will become apparent to those having ordinary skill in the art upon examination of the following, or may be learned from the practice of the invention. The advantages and features of the invention may be realized and obtained as particularly pointed out in the appended claims.

According to the present invention, the foregoing and other advantages are achieved in part by a method of forming a contact through a material. The method may include forming a via through a dielectric material and cleaning the via using a dilute hydrofluoric (DHF) acid solution. The method may further include depositing a barrier layer within the via and depositing metal adjacent the barrier layer.

According to another aspect of the invention, a method of forming a contract may include cleaning a via that extends through a dielectric layer using a dilute hydrofluoric (DHF) acid solution. The method may further include forming, after the cleaning of the via, a contact within the via.

Other advantages and features of the present invention will become readily apparent to those skilled in this art from the following detailed description. The embodiments shown and described provide illustration of the best mode contemplated for carrying out the invention. The invention is capable of modifications in various obvious respects, all without departing from the invention. Accordingly, the drawings are to be regarded as illustrative in nature, and not as restrictive.

BRIEF DESCRIPTION OF THE DRAWINGS

Reference is made to the attached drawings, wherein elements having the same reference number designation may represent like elements throughout.

FIGS. 7A & 7B illustrate the formation of a spacer in the via of FIGS. 6A & 6B consistent with an aspect of the invention;

FIGS. 9A & 9B illustrate the formation of metal layers over the spacer of FIGS. 8A & 8B consistent with an aspect of the invention; and FIGS. 10A & 10B illustrate the formation of a contact over the metal layers within the via of FIGS. 9A & 9B consistent with an aspect of the invention.

BEST MODE FOR CARRYING OUT THE INVENTION

The following detailed description of the invention refers to the accompanying drawings. The same reference numbers in different drawings may identify the same or similar elements. Also, the following detailed description does not limit the invention. Instead, the scope of the invention is defined by the appended claims and their equivalents.

Figure 1:
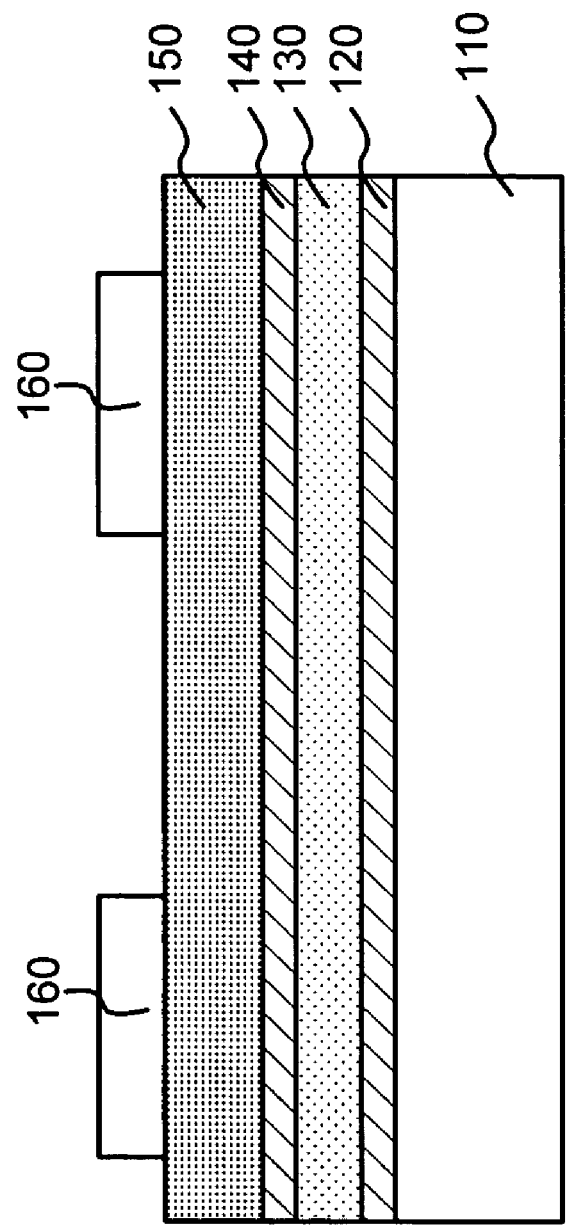
FIG. 1 is a cross-section illustrating exemplary layers used to form memory cells in accordance with an embodiment of the invention.

FIG. 1 illustrates the cross-section of a semiconductor device 100 formed in accordance with an embodiment of the invention. Referring to FIG. 1, semiconductor device 100 may include layers 110, 120, 130, 140 and 150. In an exemplary embodiment, layer 110 may be a substrate of semiconductor device 100 and may include silicon, germanium, silicon-germanium or other semiconducting materials. In alternative implementations, layer 110 may be a conductive layer or a dielectric layer formed a number of layers above the surface of a substrate in semiconductor device 100.

Layer 120 may be a dielectric layer formed on layer 110 in a conventional manner. In an exemplary implementation, dielectric layer 120 may include an oxide, such as a silicon oxide (e.g., $SiO_2$), a high K hafnium oxide, or an alumina oxide, and may have a thickness ranging from about 20 Å to about 120 Å. Dielectric layer 120 may function as a tunnel oxide layer for a subsequently formed memory cell of semiconductor device 100.

Layer 130 may be formed on layer 120 in a conventional manner and may include a dielectric material, such as a nitride (e.g., a silicon nitride). Layer 130, consistent with the invention, may act as a charge storage layer for semiconductor device 100 and may have a thickness ranging from about 20 Å to about 120 Å. In alternative implementations, layer 130 may include a conductive material, such as polycrystalline silicon, used to form a floating gate electrode.

Layer 140 may be formed on layer 130 in a conventional manner and may include a dielectric material, such as an oxide (e.g., $SiO_2$). Alternatively, layer 140 may include another dielectric material, such as a silicon oxynitride, that may be deposited or thermally grown on layer 130. In still other alternatives, layer 140 may be a composite that includes a number of dielectric layers or films. Layer 140 may have a thickness ranging from about 20 Å to about 120 Å and may function as an inter-gate dielectric for memory cells in semiconductor device 100.

Layer 150 may include a conductive material, such as polycrystalline silicon, formed on layer 140 in a conventional manner. Alternatively, layer 150 may include other semiconducting materials, such as germanium or silicon-germanium, or various metals, such as titanium or tungsten. Layer 150, consistent with the invention, may be used to form one or more control gate electrodes for one or more memory cells in semiconductor device 100. In an exemplary implementation, layer 150 may have a thickness ranging from about 800 Å to about 2500 Å. An optional silicide layer, such as titanium silicide (not shown) may be formed on layer 150.

A photoresist material may be patterned and etched to form masks 160 on the top surface of layer 150, as illustrated in FIG. 1. Masks 160 may be used to facilitate formation of one or memory cells in semiconductor device 100, as described in more detail below.

Figure 2:
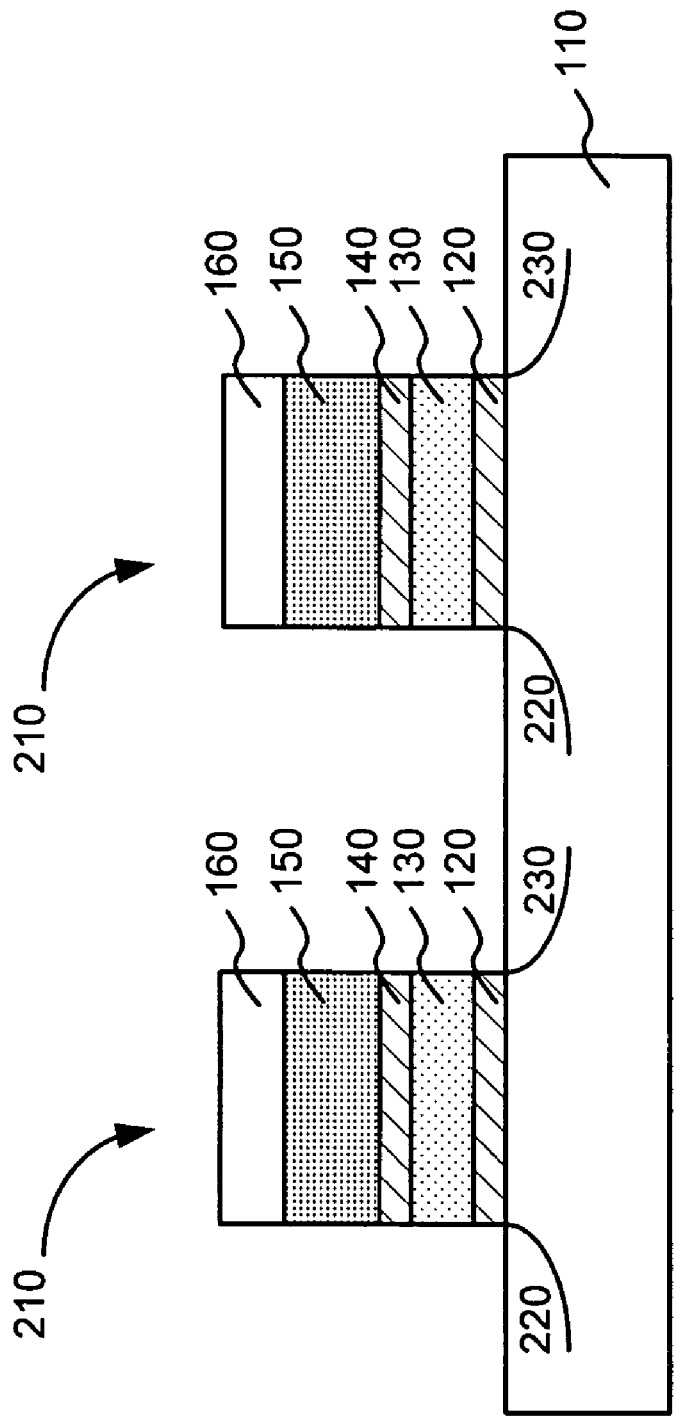
FIG. 2 is a cross-section illustrating the formation of memory cells in accordance with an embodiment of the invention.

Semiconductor device 100 may then be etched, as illustrated in FIG. 2. Referring to FIG. 2, layers 120-150 may be etched in a conventional manner with the etching terminating at substrate 110, thereby forming structures 210. Each structure 210 (also referred to herein as a memory cell 210) may represent a memory cell of semiconductor device 100, where each memory cell 210 includes a dielectric layer 120, a charge storage layer 130, an inter-gate dielectric layer 140 and a control gate electrode 150. Only two memory cells 210 are illustrated in semiconductor device 100 in FIG. 2 for simplicity. It should be understood that semiconductor device 100 may typically include a memory array including a large number of memory cells 210.

In an exemplary implementation consistent with the invention, each memory cell 210 may be a SONOS-type memory cell, with a silicon control gate electrode 150 formed on an oxide-nitride-oxide (ONO) stack (i.e., layers 140, 130 and 120), with nitride layer 130 acting as a charge storage layer, and the ONO stack being formed on a silicon substrate 110.

Source and drain regions 220 and 230 may then be formed in substrate 110, as illustrated in FIG. 2. For example, n-type or p-type impurities may be implanted in substrate 110 to form source and drain regions 220 and 230, based on the particular end device requirements. In one implementation, an n-type dopant, such as phosphorous or arsenic, may be implanted at a dosage ranging from about $2 \times 10^{13}$ atoms/cm$^2$ to about $4 \times 10^{15}$ atoms/cm$^2$ and an implantation energy ranging from about 2 KeV to about 60 KeV. Alternatively, a p-type dopant, such as boron, may be implanted at similar dosages and implantation energies. The particular implantation dosages and energy used to form source and drain regions 220 and 230 may be selected based on the particular end device requirements. One of ordinary skill in the art would be able to optimize the source/drain implantation process based on the particular circuit requirements. It should also be understood that source region 220 and drain region 230 may alternatively be formed at other points in the fabrication process of semiconductor device 100. For example, sidewall spacers may be formed prior to the source/drain ion implantation to control the location of the source/drain junctions based on the particular circuit requirements.

Figure 3:
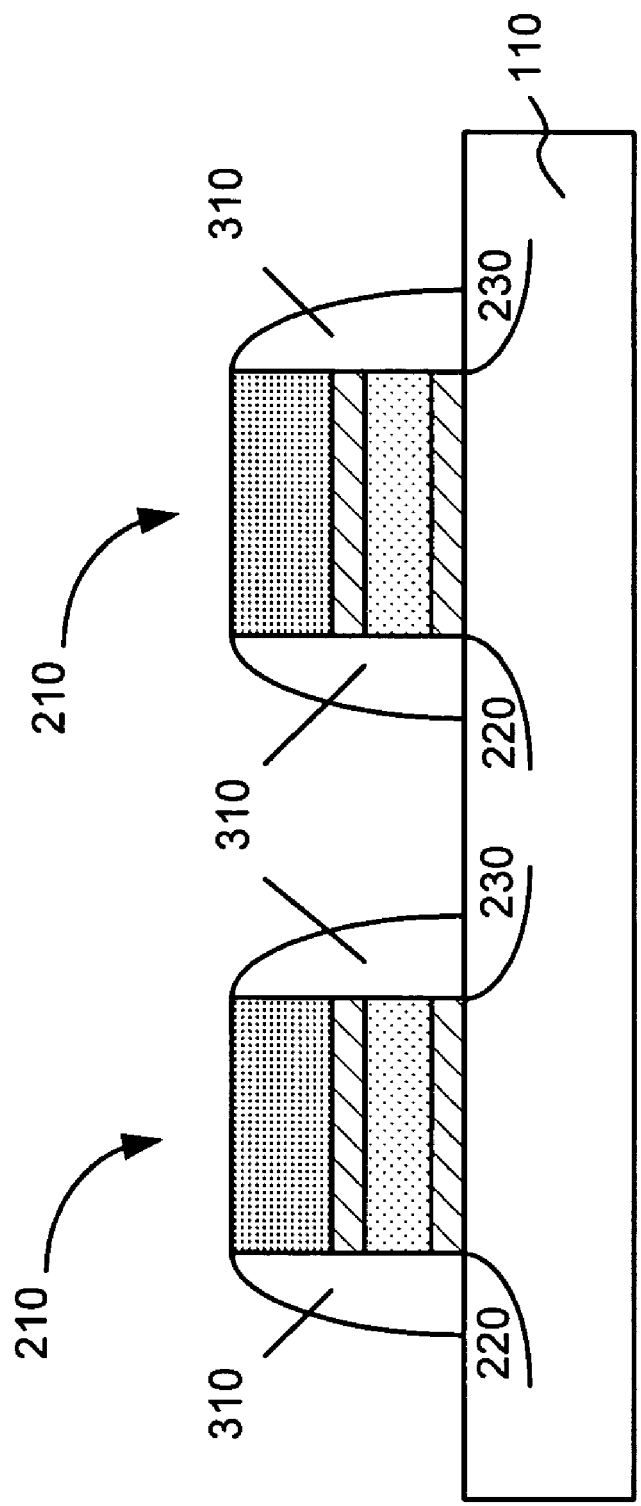
FIG. 3 is a cross-section illustrating the formation of spacers on the memory cells of FIG. 2 in accordance with an embodiment of the invention.

Photoresist masks 160 may be removed using a conventional process. Spacers 310 may be formed adjacent the sidewalls of the memory cells 210, as illustrated in FIG. 3. For example, a dielectric material, such as a silicon oxide, a silicon oxynitride or another dielectric material, may be deposited and etched to form spacers 310 on each side of memory cells 210. Spacers 310 may be used to electrically isolate adjacent memory cells 210 from each other. Spacers 310 may also be used to facilitate the deposition of impurities in semiconductor device 100.

Figure 4A:
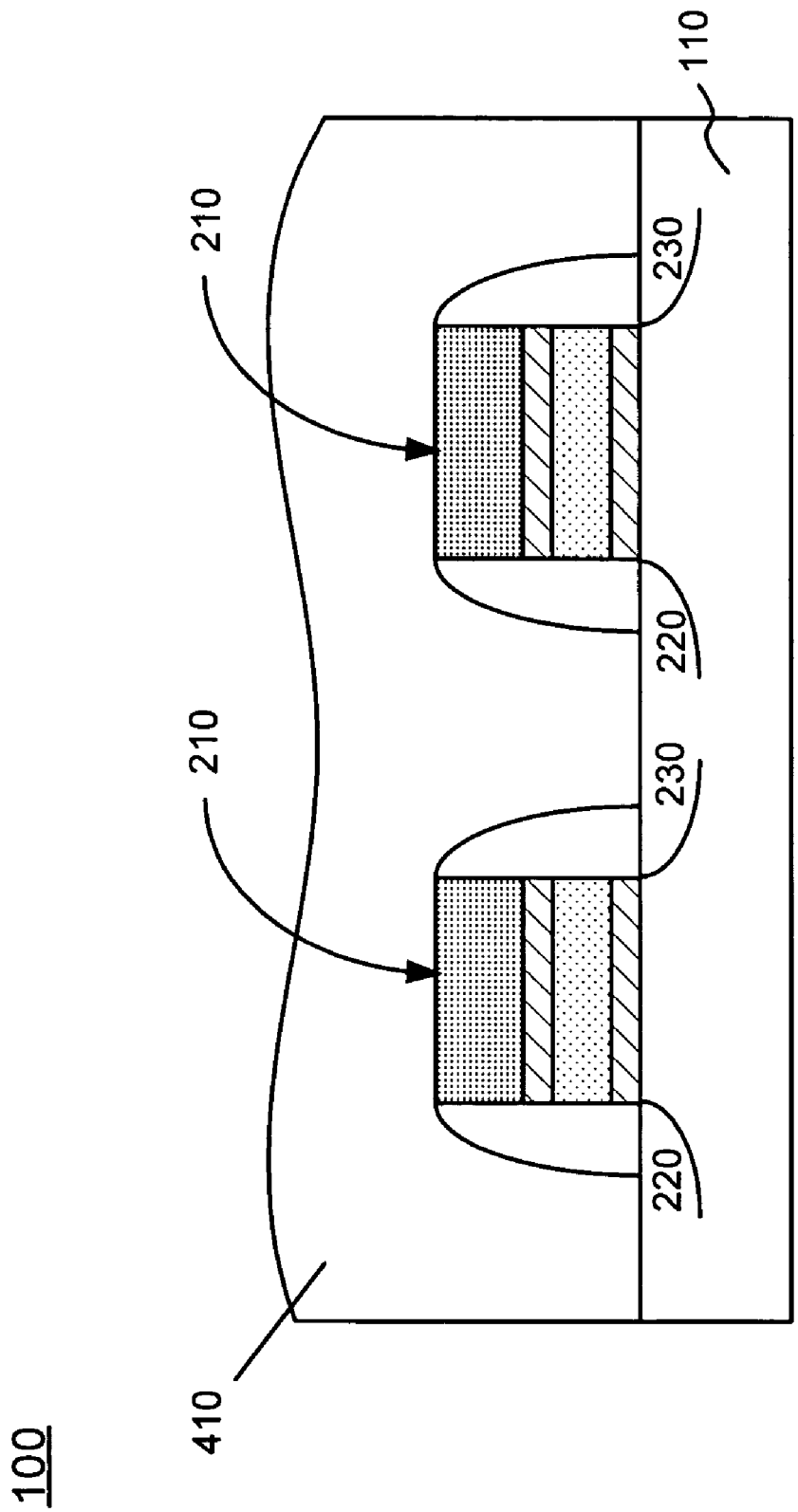
FIG. 4A is a cross-section illustrating the formation of an interlayer dielectric on the device of FIG. 3 in accordance with an embodiment of the invention.

A dielectric layer 410 may then be deposited over semiconductor device 100, as illustrated in FIG. 4A. Dielectric layer 410, also referred to as interlayer dielectric (ILD) 410 may have a thickness ranging from about 1,000 Å to about 11,000 Å and may act as an ILD for semiconductor device 100. ILD 410, may include, for example, a phoshphosilicate glass (PSG) material, a boro-phosphosilicate glass (BPSG) material, an oxide or some other dielectric material.

Figure 4B:
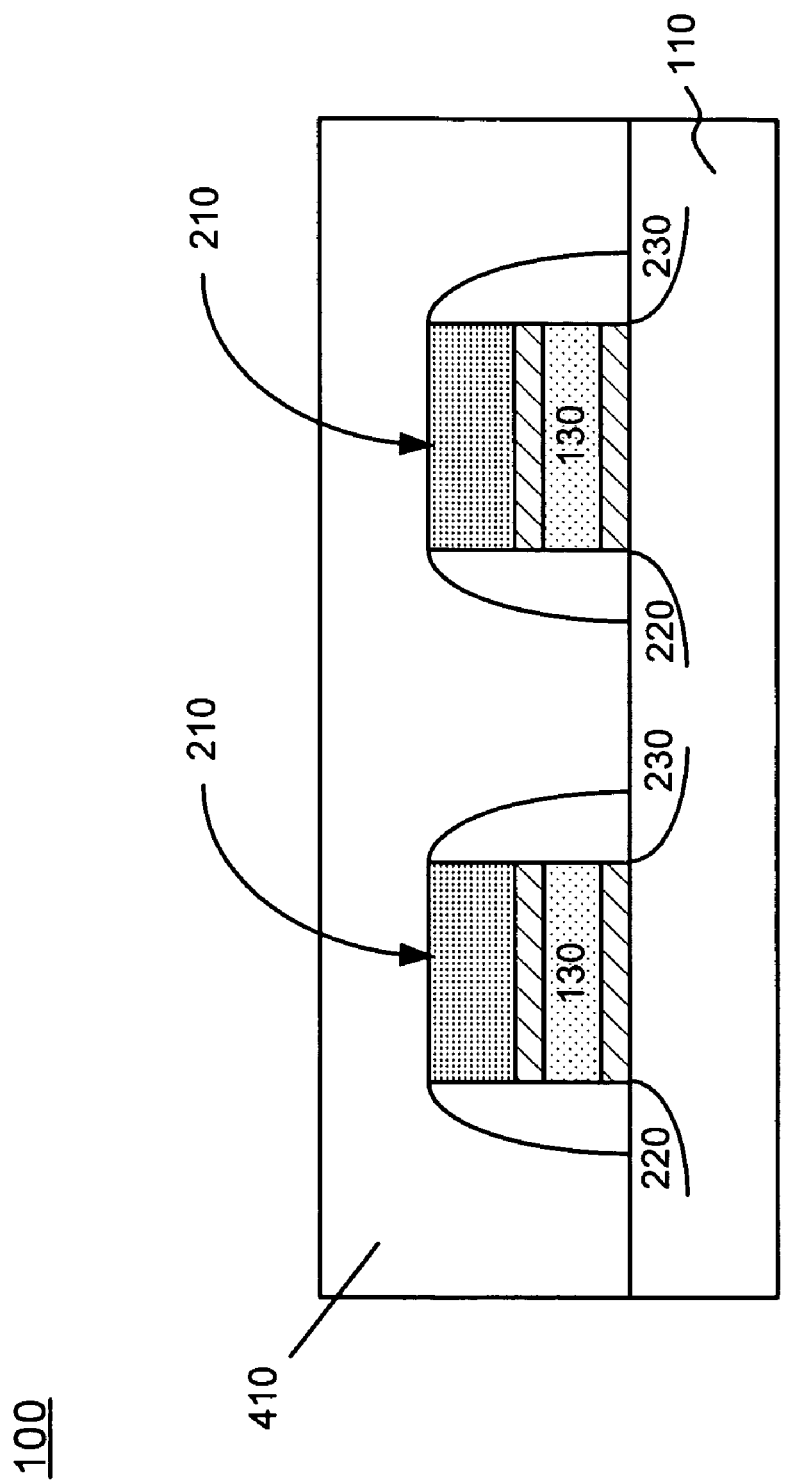
FIG. 4B is a cross-section illustrating the planarization of the interlayer dielectric of FIG. 4A in accordance with an embodiment of the invention.

ILD 410 may optionally be planarized using a conventional process, such as a chemical-mechanical polishing (CMP) process, as illustrated in FIG. 4B. Referring to FIG. 4B, the CMP process may planarize the top surface of ILD 410 to facilitate formation of subsequent structures, such as interconnect lines. ILD 410, consistent with the invention, may represent an ILD located closest to substrate 110. In alternative implementations, ILD 410 may represent an interlayer dielectric formed a number of layers above the surface of substrate 110. In each case, ILD 410 functions to isolate various conductive structures, such as various interconnect lines or to isolate source region 220 or drain region 230 from other conductive structures.

Figure 5A:
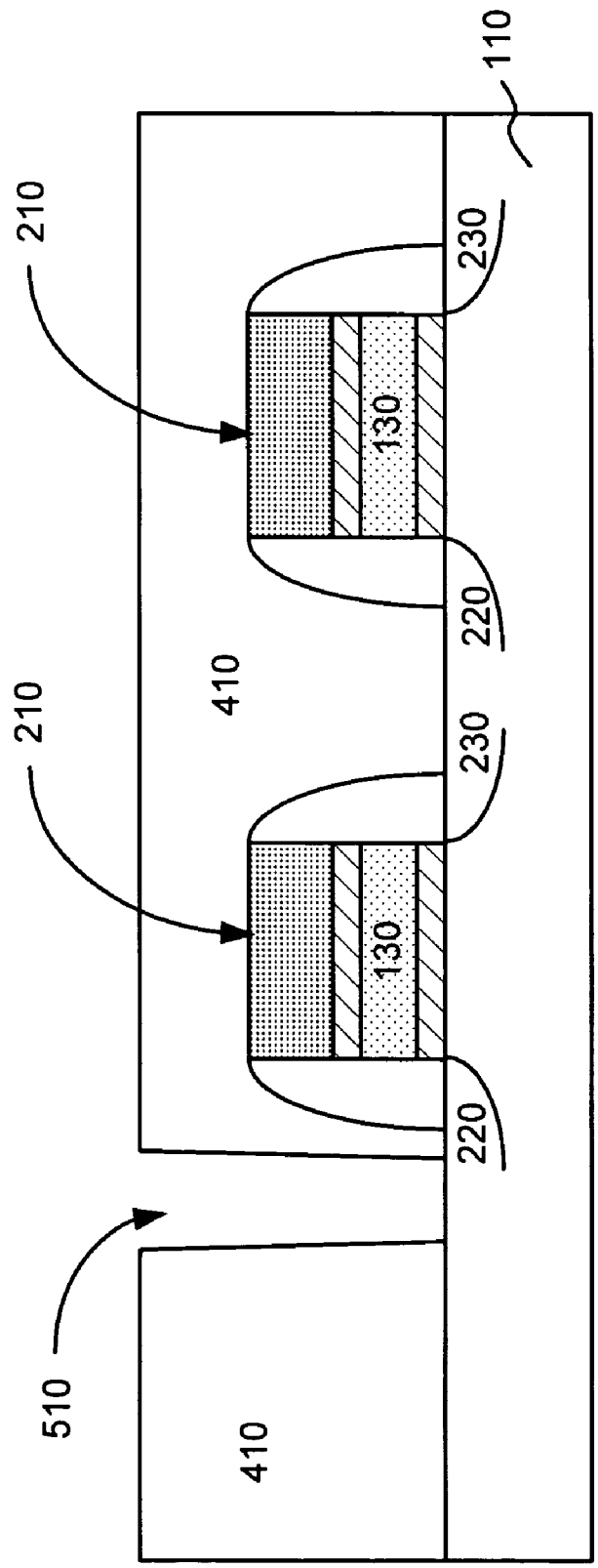
FIGS. 5A & 5B illustrate the formation of a via in the interlayer dielectric of FIG. 4B in accordance with an embodiment of the invention.
Figure 5B:
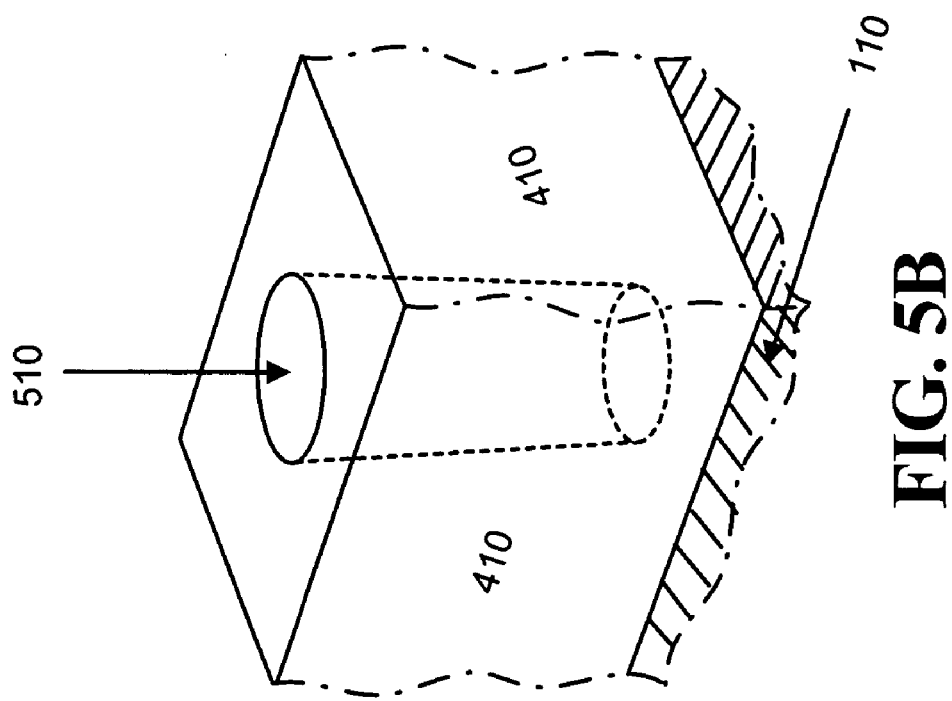

A via 510 may be formed in ILD 410 using conventional photolithographic and etching techniques, as illustrated in FIGS. 5A and 5B. Via 510 may, for example, be used to form a contact to source region 220 or drain region 230. The diameter of via 510 may range, for example, from about 200 Å to about 4,000 Å. In one exemplary embodiment, the diameter of via 510 may be approximately 800 Å.

Figure 6B:
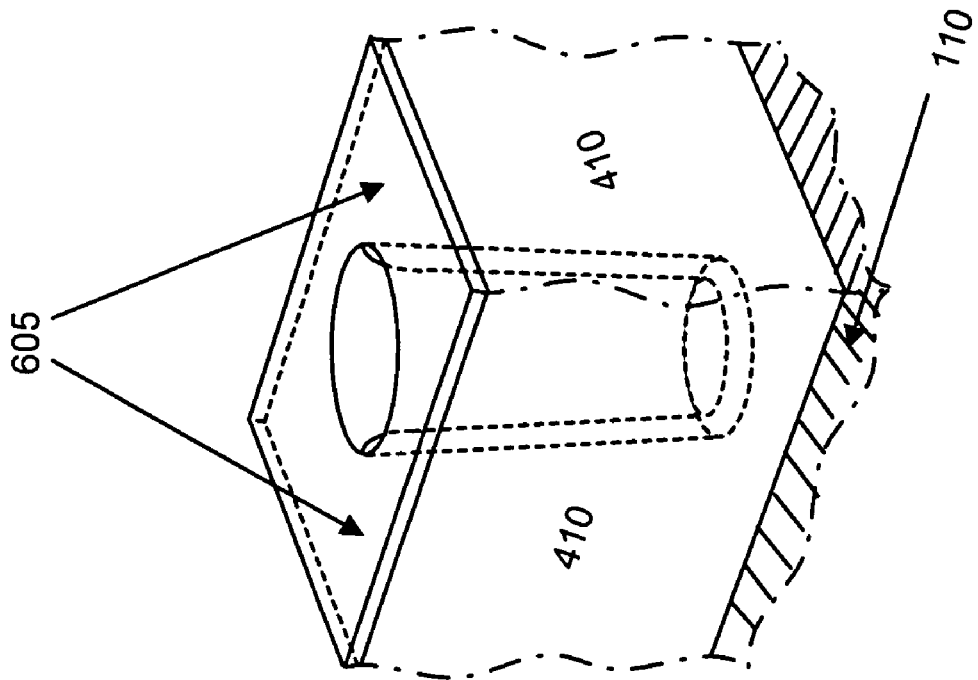
FIGS. 6A & 6B illustrate the formation of a conformal layer within the via of FIGS. 5A & 5B consistent with an aspect of the invention.
Figure 6A:
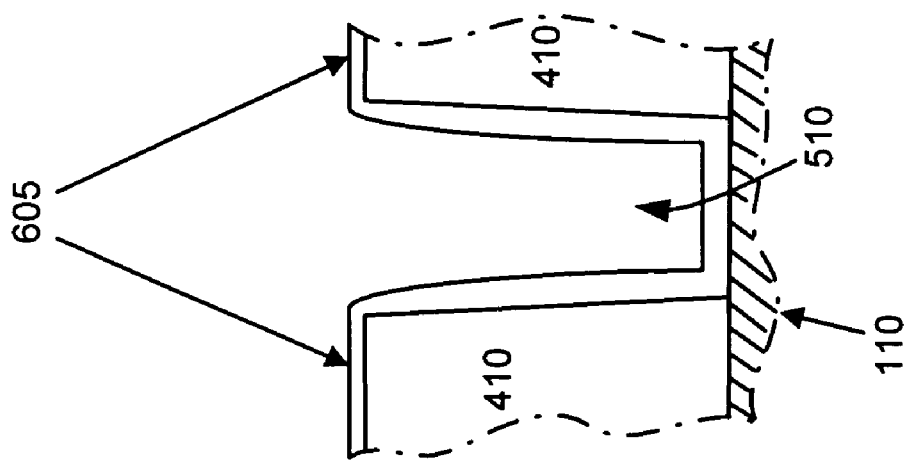

As shown in FIGS. 6A & 6B, a conformal layer 605 may, optionally, be formed on the surfaces of via 510. Layer 605 may be formed, for example, using existing deposition processes and may include a nitride material such as, for example, silicon nitride (SiN) or silicon oxide nitride (SiON). The thickness of layer 605 may range, for example, from about 50 Å to about 500 Å. In one exemplary embodiment, the thickness of layer 605 may be approximately 300 Å.

In an optional implementation in which conformal layer has been formed in via 510, portions of conformal layer 605 may then be removed, as shown in FIGS. 7A & 7B, using, for example, existing etching processes 705, to leave a spacer 710 on the sidewalls of via 510. The portion of layer 605 in the bottom of via 510, and portions of layer 605 formed on top of ILD 410, may be etched away to create spacer 710. In one alternative implementation of the invention, the aggressive cleaning process may be performed, with proper concentrations, without formation of conformal layer 605 and spacer 710 in via 510.

Figure 8B:
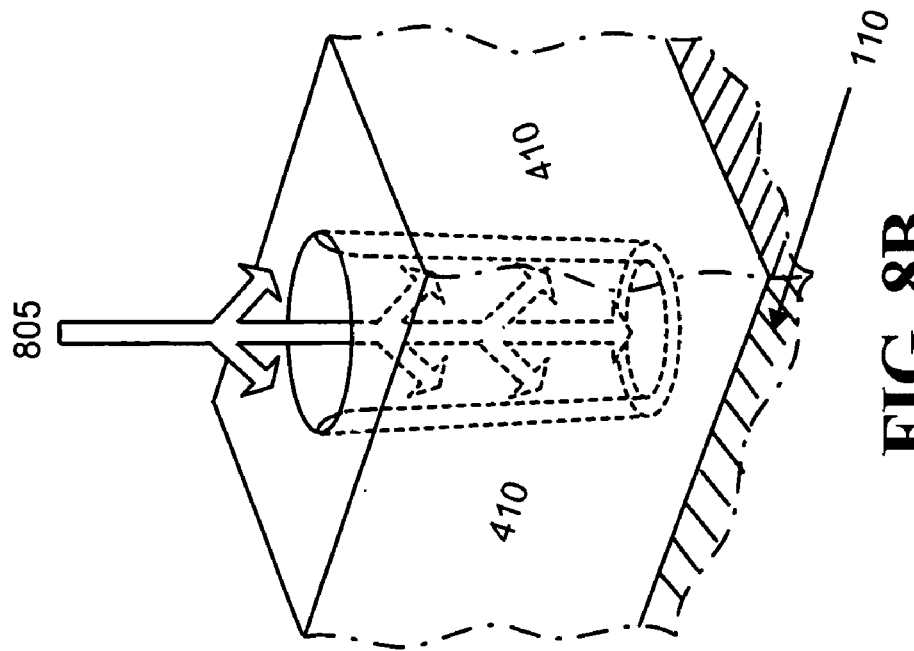
FIGS. 8A & 8B illustrate a cleaning process performed within the via of FIGS. 7A & 7B consistent with an aspect of the invention.
Figure 8A:
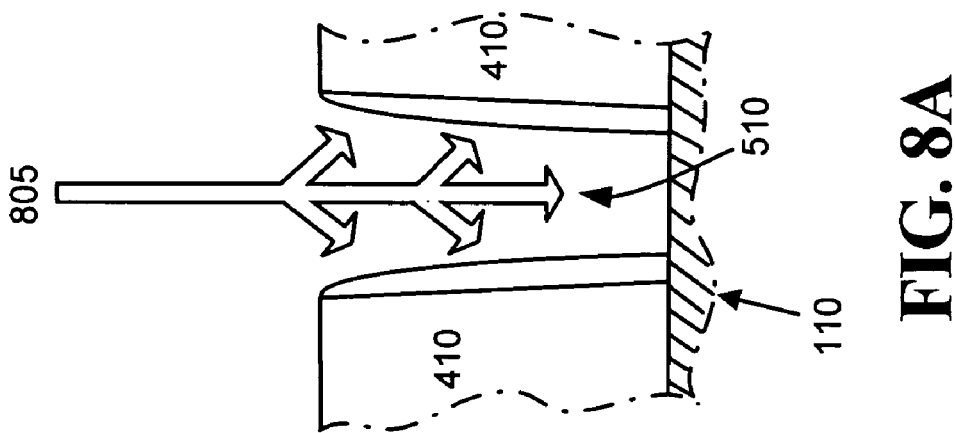

An aggressive cleaning process may be performed within via 510, as shown by arrows 805 in FIGS. 8A & 8B. The cleaning process 805 may include cleaning via 510 with a dilute hydrofluoric acid (DHF) mix (HF/$H_2O$). The concentration of HF to $H_2O$ within the DHF mix may range from about 10:1 to about 500:1. The cleaning process may further include cleaning via 510 with an ammonium hydroxide hydrogen peroxide mix (APM) ($NH_4OH/H_2O_2/H_2O$). The concentration of $NH_4OH/H_2O_2/H_2O$ may range from about 1:1.2:8 to about 1:2.5:12. The cleaning process may, in addition to, or as a substitute for, the APM, include cleaning via 510 with a sulfuric acid hydrogen peroxide mix (SPM) ($H_2SO_4/H_2O_2$). The concentration of $H_2SO_4/H_2O_2$ may range from about 1:1 to about 5:1. As a result of the cleaning process, a clean surface may be provided in the bottom of via 510 for subsequent barrier metal formation.

A first barrier metal layer 905 may then be formed over spacer 710, as shown in FIGS. 9A and 9B. Layer 905 may be formed using, for example, existing deposition processes and may include titanium (Ti). The thickness of layer 905 may range, for example, from about 20 Å to about 400 Å. A second barrier metal layer 910 may be formed over layer 905. Layer 910 may be formed using, for example, existing deposition processes and may include TiN. The thickness of layer 910 may range, for example, from about 20 Å to about 300 Å. In one exemplary embodiment, the combined thickness of layers 905 and 910 may be approximately 200 Å. An annealing process may be performed to react the titanium with the underlying semiconducting material (e.g., silicon) in layer 110 to form a region 915 of titanium silicide, or an intermix of Ti and Si, at the bottom of via 510. Advantageously, the cleaning process described above provides a clean surface for the deposition of the titanium and the formation of, for example, $TiSi_2$ or an intermix of Ti and Si at the bottom of via 510. This helps reduce the overall resistance of the subsequently formed contact.

As shown in FIGS. 10A & 101B, a contact 1005 may be formed over barrier metal layers 905 and 910 within via 510. Contact 1005 may be formed using, for example, existing deposition processes. Contact 1005 may include tungsten (W). Other existing contact materials, such as, for example, copper, aluminum, or titanium may be used. Contact 1005 may be formed to substantially fill via 510.

Use of the aggressive cleaning process, as described above with respect to FIGS. 8A and 8B facilitates interdiffusion and enhances the subsequent formation of silicide (e.g., $TiSi_2$) or an intermix of Ti and Si, between barrier metal layer 905 and layer 110, thus, facilitating a better interface between layer 905 and layer 110 that significantly lowers contact resistance. The aggressive cleaning process additionally reduces the ultra-violet (UV) and/or plasma damage caused by existing cleaning processes, such as, for example, argon sputtering, that may induce charging and/or UV damage that may possibly cause more device charge loss. The aggressive cleaning process, therefore, reduces device charge loss as compared to existing via cleaning techniques.

Existing cleaning techniques, such as argon sputtering, additionally produce a relatively large "flare" of the upper portions of barrier metal layers 905 and 910 and contact 1005 (i.e., the slope of layers 905 and 910). This large "flare" may result in increased leakage current between adjacent contacts formed over layers 905 and 910. The large flare of the contact may cause closely spaced, adjacent vias 510 to "short" to one another, or short to the adjacent metal, thus, increasing the leakage current.

In an exemplary implementation consistent with the invention, each of memory cells 210 illustrated in FIG. 5A may be configured to store two bits of data. That is, charge storage layer 130 may be programmed to store two separate bits of data by localizing the first and second charges to the respective left and right sides of charge storage layer 130 illustrated in FIG. 5A. For example, each of the two bits of memory cell 210 may be programmed independently by, for example, channel hot electron injection, to store a bit on each respective side of the charge storage layer 130. In this manner, the charges in charge storage layer 130 become effectively trapped on each respective side of charge storage layer 130. Erasing of each bit in memory cell 210 may also be performed independently. During erasing, hot holes are ejected to the storage layer to neutralize the previous electron charge (hot hole erase). Also the bits stored in charge storage layer 130 may tunnel through dielectric layer 120 into the source region 220 and drain region 230 by Fowler-Nordheim (FN) tunneling, respectively.

In this manner, the density of the array of memory cells 210 in semiconductor device 100 may be increased as compared to conventional memory devices that store only one bit of data per cell. In alternative implementations, each memory cell 210 may be configured to store one bit of data per memory cell 210. In addition, in alternative implementations, semiconductor device 100 may be a floating gate memory device in which layer 130 is formed from a conductive material, such as polysilicon, and functions as a charge storage element for each memory cell 210.

In the previous descriptions, numerous specific details are set forth, such as specific materials, structures, chemicals, processes, etc., in order to provide a thorough understanding of the present invention. However, the present invention can be practiced without resorting to the details specifically set forth herein. In other instances, well known processing structures have not been described in detail, in order not to unnecessarily obscure the thrust of the present invention. In practicing the present invention, conventional photolithographic, etching and deposition techniques may be employed, and hence, the details of such techniques have not been set forth herein in detail.

The foregoing description of embodiments of the present invention provides illustration and description, but is not intended to be exhaustive or to limit the invention to the precise form disclosed. Modifications and variations are possible in light of the above teachings or may be acquired from practice of the invention. For example, while series of acts have been described above, the order of the acts may vary in other implementations consistent with the present invention.

Only the preferred embodiments of the invention and a few examples of its versatility are shown and described in the present disclosure. It is to be understood that the invention is capable of use in various other combinations and environments and is capable of modifications within the scope of the inventive concept as expressed herein. No element, act, or instruction used in the description of the present application should be construed as critical or essential to the invention unless explicitly described as such. Also, as used herein, the article "a" is intended to include one or more items. Where only one item is intended, the term "one" or similar language is used. The scope of the invention is defined by the following claims and their equivalents.

What is claimed is:

1. A method of forming a contact, comprising:
forming a via through a dielectric material;
cleaning the via using a dilute hydrofluoric (DHF) acid solution and at least one of an ammonium hydroxide hydrogen peroxide mix (APM) or a sulfuric acid hydrogen peroxide mix (SPM),
wherein a concentration of HF to $H_2O$ within the DHF acid solution ranges from about 10:1 to about 500:1, wherein a concentration of $NH_4OH/H_2O_2/H_2O$ in the APM ranges from about 1:1.2:8 to about 1:2.5:12 and wherein a concentration of $H_2SO_4/H_2O_2$ in the SPM ranges from about 1:1 to about 5:1;
depositing a barrier layer within the via; and
depositing metal adjacent the barrier layer.

2. The method of claim 1, further comprising:
forming a spacer on sidewalls of the via prior to cleaning the via.

3. The method of claim 1, wherein depositing a metal comprises:
depositing tungsten adjacent the barrier layer to fill the via.

4. The method of claim 1, wherein the barrier layer includes a layer of titanium.

5. The method of claim 4, wherein the barrier layer further includes a layer of titanium nitride formed adjacent the layer of titanium.

6. A method of forming a contract, comprising:
cleaning a via that extends through a dielectric layer using a dilute hydrofluoric (DHF) acid solution and at least one of an ammonium hydroxide hydrogen peroxide mix (APM) or a sulfuric acid hydrogen peroxide mix (SPM),
wherein a concentration of HF to $H_2O$ within the DHF acid solution ranges from about 10:1 to about 500:1, wherein a concentration of $NH_4OH/H_2O_2/H_2O$ in the APM ranges from about 1:1.2:8 to about 1:2.5:12 and wherein a concentration of $H_2SO_4/H_2O_2$ in the SPM ranges from about 1:1 to about 5:1;
depositing, after cleaning the via, a first barrier layer comprising titanium within the via;
depositing a second barrier layer comprising titanium nitride (TiN) over the first barrier layer; and
forming a contact within the via adjacent the second barrier layer.

7. The method of claim 6, further comprising:
forming a spacer on sidewalls of the via prior to the cleaning.

8. The method of claim 6, wherein forming the contact within the via comprises:
forming tungsten over the second barrier layer.

* * * * *